United States Patent
Cha et al.

(10) Patent No.: US 10,400,324 B2
(45) Date of Patent: Sep. 3, 2019

(54) METHOD OF TREATING COMPOSITE PISTON PIN AND SURFACE TREATED COMPOSITE PISTON PIN

(71) Applicant: Hyundai Motor Company, Seoul (KR)

(72) Inventors: Sung Chul Cha, Seoul (KR); June Ho Yang, Seoul (KR); Hee Sam Kang, Seoul (KR); Chi Hoon Choi, Suwon-si (KR); Sang Yoon Park, Daejeon (KR); Jong Dae Lim, Hwaseong-si (KR); Seung Hyun Hong, Seoul (KR)

(73) Assignee: Hyundai Motor Company, Seoul (KR)

(*) Notice: Subject to any disclaimer, the term of this patent is extended or adjusted under 35 U.S.C. 154(b) by 0 days.

(21) Appl. No.: 15/364,088

(22) Filed: Nov. 29, 2016

(65) Prior Publication Data
US 2018/0023186 A1  Jan. 25, 2018

(30) Foreign Application Priority Data
Jul. 19, 2016 (KR) .................. 10-2016-0091233

(51) Int. Cl.
*C23C 16/02* (2006.01)
*C23C 28/00* (2006.01)
(Continued)

(52) U.S. Cl.
CPC ........... *C23C 14/24* (2013.01); *B29C 35/02* (2013.01); *B29C 70/30* (2013.01); *B32B 1/08* (2013.01);
(Continued)

(58) Field of Classification Search
CPC ................ B29C 70/30; B29C 70/205; B32B 2305/076; B32B 27/00; B32B 27/38; B29K 2105/0872
See application file for complete search history.

(56) References Cited

U.S. PATENT DOCUMENTS

| | | | | |
|---|---|---|---|---|
| 4,362,590 A | * | 12/1982 | Driver | B29C 70/22 156/165 |
| 4,572,058 A | * | 2/1986 | Hinz | F16J 1/16 123/193.6 |

(Continued)

FOREIGN PATENT DOCUMENTS

| | | |
|---|---|---|
| JP | H02-113170 | 4/1990 |
| JP | H06-344476 A | 12/1994 |

(Continued)

OTHER PUBLICATIONS

GPP (Using Your Wet Granite Polishing Pads for Polishing Granite and Concrete, http://www.granitepolishingpads.com/GPP.pdf, Retrieved Apr. 14, 2018, Published on Apr. 23, 2013 (Year: 2013).*

(Continued)

*Primary Examiner* — Francisco W Tschen
(74) *Attorney, Agent, or Firm* — Morgan, Lewis & Bockius LLP

(57) ABSTRACT

Disclosed herein is a method of treating a composite piston pin, including: preparing the piston pin of which at least surface layer includes a composite material including a reinforcing fiber and a resin; improving roughness by processing the surface layer of the piston pin; and forming a coating layer on the surface layer processed to reduce a friction coefficient of the piston pin.

4 Claims, 3 Drawing Sheets

100: 110,120

(51) Int. Cl.
*B29C 70/30* (2006.01)
*B32B 27/38* (2006.01)
*B29K 105/08* (2006.01)
*C23C 14/24* (2006.01)
*B29C 35/02* (2006.01)
*B32B 1/08* (2006.01)
*B32B 5/26* (2006.01)
*C23C 14/02* (2006.01)
*C23C 14/08* (2006.01)
*C23C 16/44* (2006.01)
*F16J 1/16* (2006.01)
*C23C 14/06* (2006.01)
*C23C 16/30* (2006.01)
*C23C 30/00* (2006.01)
*B29L 31/00* (2006.01)

(52) U.S. Cl.
CPC ............... *B32B 5/26* (2013.01); *B32B 27/38* (2013.01); *C23C 14/024* (2013.01); *C23C 14/025* (2013.01); *C23C 14/028* (2013.01); *C23C 14/06* (2013.01); *C23C 14/08* (2013.01); *C23C 16/0254* (2013.01); *C23C 16/0272* (2013.01); *C23C 16/30* (2013.01); *C23C 16/44* (2013.01); *C23C 28/00* (2013.01); *C23C 28/30* (2013.01); *C23C 28/32* (2013.01); *C23C 28/323* (2013.01); *C23C 28/324* (2013.01); *C23C 28/343* (2013.01); *C23C 30/005* (2013.01); *F16J 1/16* (2013.01); *B29K 2105/0872* (2013.01); *B29L 2031/7494* (2013.01); *B32B 2305/076* (2013.01); *B32B 2605/00* (2013.01)

(56) References Cited

U.S. PATENT DOCUMENTS

| | | | |
|---|---|---|---|
| 4,623,228 A * | 11/1986 | Galasso | C03C 14/002 359/848 |
| 5,260,121 A | 11/1993 | Gardner et al. | |
| 5,721,030 A | 2/1998 | Okada | |
| 6,364,565 B1 * | 4/2002 | Billimack | F16J 1/18 403/150 |
| 2002/0071920 A1 | 6/2002 | Obeshaw | |
| 2006/0236972 A1 * | 10/2006 | Savale | F02B 77/02 123/193.6 |
| 2012/0177872 A1 * | 7/2012 | Tsai | B29C 70/202 428/113 |
| 2013/0220115 A1 * | 8/2013 | Kantola | F16J 1/006 92/187 |
| 2016/0009876 A1 | 1/2016 | Rodriguez et al. | |

FOREIGN PATENT DOCUMENTS

| | | |
|---|---|---|
| JP | H08-216300 A | 8/1996 |
| JP | H10-299761 | 11/1998 |
| JP | 2002-067070 A | 3/2002 |
| JP | 2006-090525 | 4/2006 |
| JP | 5679089 B1 | 3/2015 |
| KR | 1997-0064781 A | 10/1997 |
| KR | 2001-0016305 A | 3/2001 |
| KR | 10-2003-0004495 A | 1/2003 |
| KR | 10-2011-0066716 | 6/2011 |
| KR | 10-2013-0097869 A | 9/2013 |
| KR | 10-2014-0038084 A | 3/2014 |
| KR | 10-2014-0123245 A | 10/2014 |
| WO | WO 2007/132734 A1 | 11/2007 |
| WO | WO 2014/136876 A1 | 9/2014 |

OTHER PUBLICATIONS

Machine Translation of KR101428600B1; Korean cited in IDS (Year: 2014).*

Machine Translation of KR20010016305; Korean cited in IDS (Year: 2001).*

Czel et al., Demonstration of pseudo-ductility in high performance glass/epoxy composites by hybridization with thin-ply carbon prepeg, Composites: Part A, 52, 23-30 (Year: 2013).*

* cited by examiner

METHOD OF TREATING COMPOSITE PISTON PIN AND SURFACE TREATED COMPOSITE PISTON PIN

CROSS REFERENCE TO RELATED APPLICATION

The present application claims priority to Korean Patent Application No. 10-2016-0091233, filed on Jul. 19, 2016, the entire contents of which is incorporated herein for all purposes by this reference.

BACKGROUND OF THE INVENTION

Field of the Invention

The present invention relates to a method of treating a composite piston pin configured for reducing a friction by improving roughness of a surface of the composite piston pin and performing coating treatment on the surface.

Description of Related Art

The existing piston pin made only of a steel material like SMC415 steel has a heavy weight, and therefore does not contribute to improvement in fuel efficiency when being applied to a vehicle and does not have satisfactory properties in a flexural strength in a hoop direction and a flexural strength in a length direction that are required for the piston pin. Therefore, there is a need to manufacture a piston pin that may replace the existing piston pin.

Accordingly, a method of using a piston pin having a light weight and an excellent strength and treating a surface of the piston pin made of the composite material to improve fuel efficiency when the piston pin is applied to an engine is proposed.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a method of treating a composite piston pin configured for reducing a friction by improving roughness of a surface of the composite piston pin and performing coating treatment on the surface.

According to an exemplary embodiment of the present invention, there is provided a method of treating a composite piston pin, including: preparing the piston pin of which at least surface layer includes a composite material including a reinforcing fiber and a resin; improving roughness by processing a surface layer of the piston pin; and forming a coating layer on the surface layer processed to reduce a friction coefficient of the piston pin.

The preparing may include: a first rolling step of rolling a first prepreg including a reinforcing fiber and a resin to enclose an outside surface of a cylindrical mold; a second rolling step of rolling a second prepreg including a reinforcing fiber having elasticity higher than that of the reinforcing fiber of the first prepreg and a resin to enclose an outside surface of the first prepreg; and a molding step of putting the first prepreg and the second prepreg rolled on the mold in an oven and integrally molding the first prepreg and the second prepreg.

The improving may include: a grinding step of grinding the surface layer of the piston pin; a first polishing step of polishing the ground surface layer of the piston pin using a polishing solution having Ra equal to or less than 6 µm; and a second polishing step of polishing the surface layer of the piston pin using the polishing solution having Ra equal to or less than 1 µm.

The forming of the coating layer may include: a first coating step of depositing a bonding layer made of Cr or Ti on the surface layer; a second coating step of depositing a support layer made of CrN or WC on the bonding layer; and a third coating step of depositing a functional layer made of (SiO)-diamond like carbon (DLC) on the support layer.

The forming of the coating layer may be performed at a temperature of 100 to 240° C.

According to another exemplary embodiment of the present invention, there is provided a surface treated composite piston pin, including: a composite inside layer having a pipe shape and include a reinforcing fiber and a resin; a composite outside layer configured to be connected to the inside layer along an outside surface of the inside layer, have surface roughness Ra equal to or less than 0.42 µm, and include a reinforcing fiber having elasticity higher than that of the reinforcing fiber of the inside layer and a resin; and a coating layer configured to be coated on a surface of the outside layer to reduce a friction coefficient.

The coating layer may include: a bonding layer configured to be deposited on the surface of the outside layer and made of Cr or Ti; a support layer configured to be deposited on the bonding layer and made of CrN or WC; and a functional layer configured to be deposited on the support layer and made of (SiO)-DLC.

The resin included in the inside layer and the outside layer may include an epoxy mixture and cyanate ester.

The reinforcing fiber of the outside layer may be aligned in parallel with a longitudinal direction of a pipe and the inside layer may include: a first layer configured to include a reinforcing fiber vertically aligned to the reinforcing fiber of the outside layer and be connected to the outside layer along an inner side surface of the outside layer; and a second layer configured to include a reinforcing fiber aligned in parallel with the reinforcing fiber of the outside layer and be connected to the first layer along an inside surface of the first layer.

The methods and apparatuses of the present invention have other features and advantages which will be apparent from or are set forth in more detail in the accompanying drawings, which are incorporated herein, and the following Detailed Description, which together serve to explain certain principles of the present invention.

Figure 1:
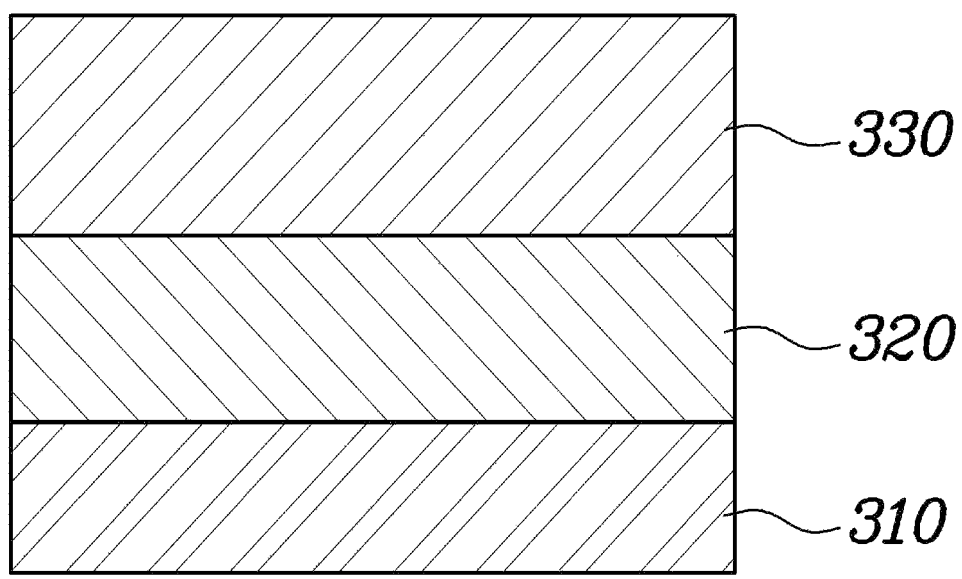
FIG. 1 is a diagram illustrating an appearance of a coating layer according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Hereinafter, exemplary embodiments of the present invention will be described with reference to the accompanying drawings.

A method of treating a composite piston pin according to an exemplary embodiment of the present invention includes: preparing the piston pin of which at least surface layer includes a composite material including a reinforcing fiber and a resin; improving roughness by processing the surface layer of the piston pin; and forming a coating layer on the surface layer processed to reduce a friction coefficient of the piston pin.

In the preparing, the piston pin including a composite material including the reinforcing fiber and the resin is prepared. Various embodiments of the present invention relates to a method of processing a surface of a composite material that is an object to be processed, and therefore the piston pin of which the surface layer forming the outermost side of the piston pin including the composite material may be prepared.

When the piston pin of which at least surface layer includes the composite material is prepared, the improving of the roughness by processing the surface layer of the piston pin is performed. This may be performed to increase the cohesion between the surface layer and the coating layer when the coating layer is coated on the processed surface layer to reduce a friction.

The improving may include: a grinding step of grinding the surface layer of the piston pin; a first polishing step of polishing the ground surface layer of the piston pin using a polishing solution having Ra equal to or less than 6 μm; and a second polishing step of polishing the surface layer of the piston pin using the polishing solution having Ra equal to or less than 1 μm.

First, the surface layer of the piston pin of which the at least surface layer includes the composite material is ground using a grinding means a so-called grindstone. By the process, the roughness of the surface layer may be formed to be equal to or less than approximately 0.63 μm.

When the grinding step is completed, the process of polishing the ground surface layer may be performed and may be sequentially performed over plural steps.

In the first polishing step, the polishing solution that is high-purity alumina of 98% or more and may have a particle size having Ra equal to or less than 6 μm may be used and the surface layer may be polished by a scheme of injecting the piston pin into a polishing apparatus and then rotating the piston pin in one direction at a speed of approximately 200 to 400 rpm.

The first polishing step may be performed on a piston pin having an outer diameter of approximately 20 mm and a length of approximately 50 mm for approximately 30 seconds using a polishing solution having Ra (roughness of surface layer) equal to or less than 6 μm and may be performed on a piston pin having an outer diameter of approximately 40 mm and a length of approximately 90 mm for approximately 60 seconds.

When the first polishing step is completed, the surface layer having roughness below a predetermined level by the first polishing step may be again polished by the second polishing step by a scheme of injecting a piston pin into a polishing apparatus using a polishing solution that is high-purity alumina of 98% or more and may have a particle size having Ra equal to or less than 6 μm and then rotating the piston pin in one direction at a speed of approximately 200 to 400 rpm.

The second polishing step may be performed on a piston pin having an outer diameter of approximately 20 mm and a length of approximately 50 mm for approximately 20 seconds using a polishing solution having Ra (roughness of surface layer) equal to or less than 1 μm and may be performed on a piston pin having an outer diameter of approximately 40 mm and a length of approximately 90 mm for approximately 40 seconds.

Referring to FIG. 1, when the improving of the roughness of the surface layer is completed, the coating for reducing the friction coefficient of the surface layer is performed. In the forming of the coating layer, a coating layer 310 is formed on the surface layer to reduce the friction coefficient of the piston pin.

The forming of the coating layer may include: a first coating step of depositing a bonding layer 310 made of Cr or Ti on the surface layer; a second coating step of depositing a support layer 320 made of CrN or WC on the bonding layer 310; and a third coating step of depositing a functional layer 330 made of (SiO)-diamond like carbon (DLC) on the support layer 320.

The surface layer is activated by injecting the piston pin having the improved roughness of the surface layer into the coating equipment having a vacuum chamber, forming the chamber to be a plasma state through the argon (Ar) gas, and then heating the chamber to approximately 80° C. A process of cleaning the surface layer is first performed by colliding an argon (Ar) ion on the activated surface layer to apply bias thereto.

Next, in the first coating step, the bonding layer 310 made of Cr or Ti is deposited on the surface layer by a PVD method. The bonding layer 310 serves to improve an adhesion between the surface layer of the piston pin and the support layer 320 to be deposited on the bonding layer 310. A thickness of the bonding layer 310 may be formed to be 0.01 to 0.5 μm. When the thickness is less than 0.01 μm, the effect of improving the adhesion is not large, while when the thickness exceeds 0.5 μm, the thickness of the bonding layer 310 is rather thick and thus the adhesion may be reduced.

In the second coating step, the support layer 320 made of CrN or WC is deposited on the bonding layer 310 by the PVD method. By letting process gas N2 flow into the chamber, a CrN layer may be formed by using a Cr target or a WC layer may be formed using a WC target. The support layer 320 serves to improve fatigue resistance and impact resistance between the bonding layer 310 and the functional layer 330 to be deposited on the support layer 320. A thickness of the support layer 320 may be formed to be 0.1 to 0.5 μm. When the thickness is less than 0.1 μm, the support layer may be delaminated when being applied with a load, while when the thickness exceeds 0.5 μm, an internal pressure is increased and thus toughness, hardness, or the like may be reduced.

In the third coating step, the function layer 330 made of (SiO)-DLC is deposited on the support layer 320 by the PVD method or a PACVD method. A chemical reaction is performed using a Si target or a C target and carbonization gas and hexamethyldisiloxane (HMDSO) gas, forming the functional layer 330. The functional layer 330 serves to improve wear resistance, low friction property, heat resistance, or the like. A thickness of the functional layer 330 may be formed to be 0.1 to 10 μm. When the thickness is less than 0.1 μm, the improvement effect in the wear resistance, the low friction property, the heat resistance, and the like is not large, while when the thickness exceeds 10 μm, the delamination phenomenon may be caused.

The forming of the coating layer may be performed at a temperature of 100 to 240° C. When the coating treatment is performed at less than 100° C., when the piston pin is applied to the engine, the wear resistance may not be suitable under the corresponding environment and when the coating treatment is performed exceeding 240° C., the wear may occur.

Describing in detail the preparing, the preparing may include: a first rolling step of rolling a first prepreg 10 including a reinforcing fiber and a resin to enclose an outside surface of a cylindrical mold 30; a second rolling step of rolling a second prepreg 20 including a reinforcing fiber having elasticity higher than the of the reinforcing fiber of the first prepreg 10 and a resin to enclose an outside surface of the first prepreg 10; and a molding step of putting the first prepreg 10 and the second prepreg 20 rolled on the mold 30 in an oven and integrally molding them.

First, the first prepreg 10 is rolled on an outside surface of the cylindrical mold 30 by the first rolling step. After the sheet-like first prepreg 10 having a predetermined width is spread widely and the mold 30 is located at an end portion, the first prepreg 10 is rolled and thus encloses the outside surface of the mold 30.

Next, the second prepreg 20 having a reinforcing fiber having relatively higher elasticity is rolled on the outside surface of the first prepreg 10 by the second rolling step. After the sheet-like second prepreg 20 having a predetermined width is spread widely and the mold 30 enclosed with the first prepreg 10 is located at the end portion, the second prepreg 20 is rolled and thus encloses the outside surface of the first prepreg 10.

The second prepreg 20 of the reinforcing fiber having relatively high elasticity may be positioned at an outside layer by the first rolling step and the second rolling step and the first prepreg 10 of the reinforcing fiber having relatively low elasticity may be positioned at an inside layer.

Figure 2:
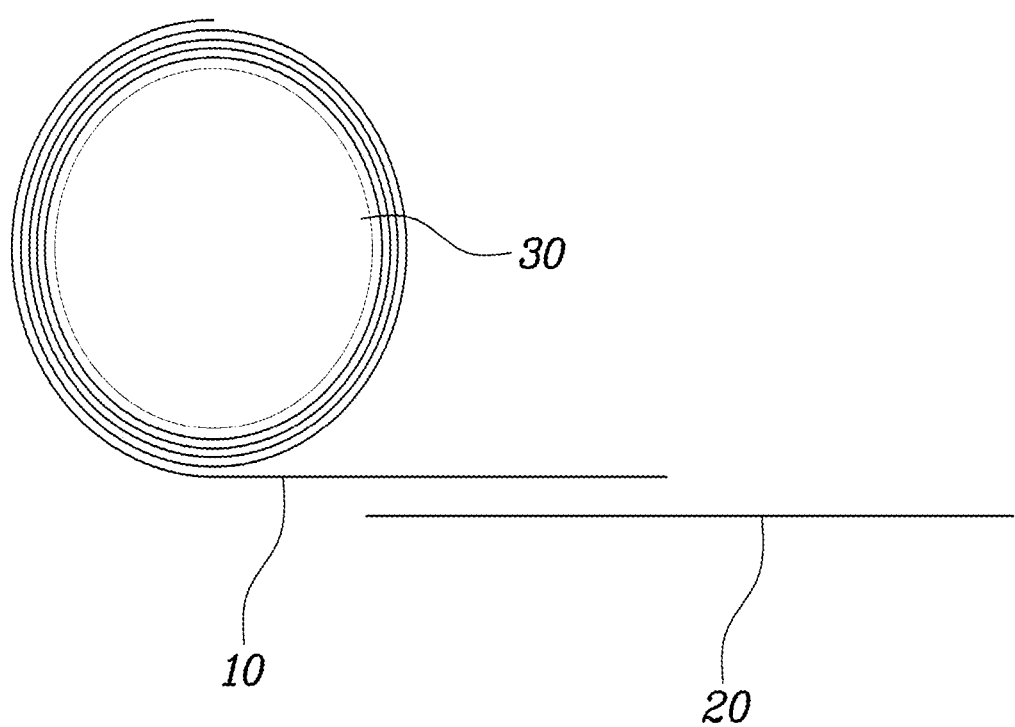
FIG. 2 is a diagram illustrating a first rolling step and a second rolling step according to an exemplary embodiment of the present invention.

As illustrated in FIG. 2, the first prepreg 10 and the second prepreg 20 are spread widely, an end portion of the first prepreg 10 and an end portion of the second prepreg 20 are connected to overlap each other, and then the first prepreg 10 and the second prepreg 20 may be rolled by the mold 30.

A heat resistant film may be wrapped on the outside surface of the second prepreg 2 rolled after the second rolling step. The film may be configured of a thermal contraction film having heat resistance.

Next, in the molding step, the first prepreg 10 and the second prepreg 20 that are wrapped by the film are put in the oven and integrally molded. The heat resistant film is wrapped on the outside surface of the second prepreg 20 and thus contracted by heat when the first and second prepregs are molded in the oven, such that pores present in the first prepreg 10 and the second prepreg 20 may be removed. The molding in the oven may be performed at a temperature of approximately 200 to 250° C. for approximately 1 hour.

After the molding step, a step of separating the heat resistant film and the mold 30 from the first prepreg 10 and second prepreg 20 molded and then cutting them at a predetermined length may be performed. The first prepreg 10 and second prepreg 20 molded are drawn out from the oven and then the heat resistant film wrapped on the outside surface of the second prepreg 20 is removed and the mold 30 enclosed with the first prepreg 10 is separated to cut the molded first prepreg 10 and second prepreg 20 for use.

According to the method of treating a composite piston pin in accordance with the exemplary embodiment of the present invention, the friction may be reduced in response to the reduction in the friction coefficient, improving the fuel efficiency when the composite piston pin is applied to the vehicle.

Figure 3:
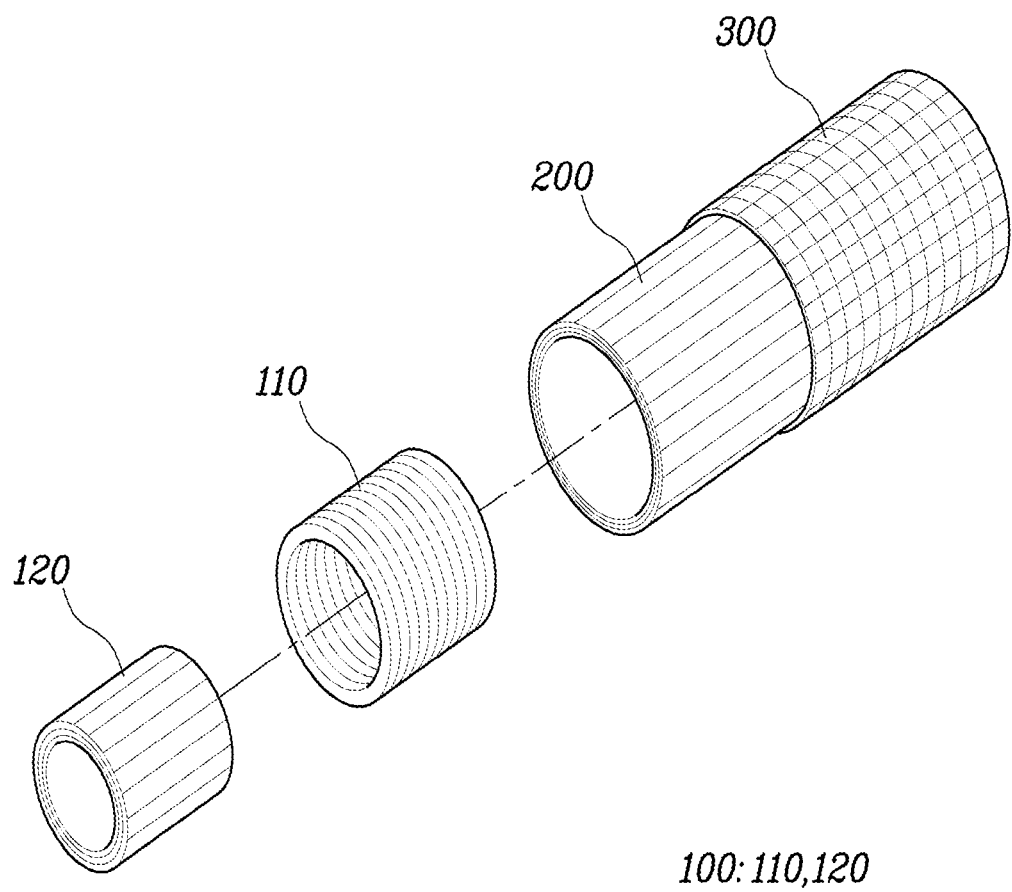
FIG. 3 is a diagram illustrating a surface treated composite piston pin according to an exemplary embodiment of the present invention.

Referring to FIG. 3, the surface treated composite piston pin according to the exemplary embodiment of the present invention includes a composite inside layer 100 having a pipe shape and including a reinforcing fiber and a resin; a composite outside layer 200 connected to the inside layer 100 along the outside surface of the inside layer 100, having surface roughness Ra equal to or less than 0.42 μm, and including a reinforcing fiber having elasticity higher than that of the reinforcing fiber of the inside layer 100 and a resin; and a coating layer 310 coated on a surface of the outside layer 200 to reduce a friction coefficient.

The resin included in the inside layer 100 and the outside layer 200 may include an epoxy mixture and cyanate ester.

Further, the reinforcing fiber of the outside layer 200 is aligned in parallel with a longitudinal direction of the pipe and the inside layer 100 may include a first layer 110 including the reinforcing fiber vertically aligned to the reinforcing fiber of the outside layer 200 and connected to the outside layer 200 along the inside surface of the outside layer 200; and a second layer 120 having the reinforcing fiber aligned in parallel with the reinforcing fiber of the outside layer 200 and connected to the first layer 110 along the inside surface of the first layer 110.

According to the foregoing manufacturing method, the inside layer 100 may correspond to the first prepreg 10 including the reinforcing fiber having the relatively lower elasticity. The reinforcing fiber may include at least one of a carbon fiber, a glass fiber, an aramid fiber, and a natural fiber. However, the reinforcing fiber is not limited thereto. The resin may include at least one of thermosetting resin like polyurethane and thermoplastic resin like polypropylene.

According to the foregoing manufacturing method, the outside layer 200 may correspond to the second prepreg 20 including the reinforcing fiber having the relatively higher elasticity. Further, by the improving step, the surface roughness Ra may be formed to be equal to or less than 0.42 μm. The reinforcing fiber of at least one of a carbon fiber, a glass fiber, an aramid fiber, and a natural fiber. However, the reinforcing fiber is not limited thereto. The resin may include at least one of thermosetting resin like polyurethane and thermoplastic resin like polypropylene.

According to the exemplary embodiment of the present invention for differently forming the elasticity of the outside layer 200 and the inside layer 100, the reinforcing fibers of the outside layer 200 and the inside layer 100 include the carbon fiber and the carbon fiber of the outside layer 200 may be a pitch-based carbon fiber and the carbon fiber of the inside layer 100 may be a PAN-based carbon fiber.

The pitch-based carbon fiber may have a modulus of elasticity of approximately 640 GPa or more. The pitch-based carbon fiber may have a high ratio of carbon and therefore has high elasticity and therefore increases a flexural strength in a hoop direction and a material strength, suppressing occurrence of oval that causes the deformation of the pin depending on the load when the pitch-based carbon fiber is applied with the load and suppressing the flexural deformation.

The PAN-based carbon fiber may have a modulus of elasticity of approximately 240 GPa or more. Generally, the PAN-based carbon fiber has high compression strength characteristics and therefore is positioned at the innermost side of the composite piston pin to serve to support the outside layer 200 and bear the load, increasing the flexural strength in the hoop direction. Therefore, it is possible to suppress the occurrence of the oval depending on the load. The PAN-based carbon fiber is relatively cheaper and therefore may save costs.

When the resin of the inside layer 100 and the outside layer 200 includes the epoxy mixture and the cyanate ester, the heat resistance is improved and when the cyanate ester increasing flowability of the resin is added to impregnate the reinforcing fiber, an air gap is reduced and the uniformity of the reinforcing fiber is improved.

Due to the addition of the cyanate ester, glass transition temperature Tg is increased. Here, the glass transition temperature Tg is a temperature associated with glass transition at which a polymer material is transited from a solid state to a liquid state. Therefore, it can be appreciated that the higher the glass transition temperature Tg, the better the heat resistance becomes. When the heat resistance is improved in resins impregnating the reinforcing fiber, firing is not suddenly generated in the molding step, and therefore the air gap may be reduced and the uniformity of the reinforcing fiber may be improved.

A mixture ratio of the epoxy mixture and the cyanate ester in the resins may range from 1:0.82 to 1:1.22. When the mixture ratio of the cyanate does not reach 0.82 with respect to the epoxy mixture, the glass transition temperature Tg is reduced and thus when the reinforcing fiber is impregnated, the air gap may occur in large quantities and the uniformity of the fiber may be reduced. On the other hand, when the mixture ratio of the cyanate exceeds 1.22, the flowability of the resins is increased and thus the moldability is not good and the viscosity of the resins is excessively low, such that it is difficult to manufacture a composite part having a uniform shape. Therefore, the mixture ratio of the epoxy mixture and the cyanate ester in the resins may range from 1:0.82 to 1:1.22.

An orientation of the reinforcing fiber of the outside layer 200 is in parallel with a longitudinal direction of the pipe, the inside layer 100 is configured to have a multilayer structure, in the case of the first layer 110 connected to the inside surface of the outside layer 200, the reinforcing fiber is aligned to be vertical to the reinforcing fiber of the outside layer 200, in a case of the second layer 120 connected to the inside surface of the first layer 110, and the reinforcing fiber is aligned to be in parallel with the reinforcing fiber of the outside layer 200, such that the reinforcing fibers of the outside layer 200, the first layer 110, and the second layer 120 have the orientation of 0°, 90°, and 0° from the outside layer. Therefore, the stiffness of the composite piston pin may be improved and the load applied from a longitudinal direction of the composite piston pin and the load the load applied from the width direction may be prepared.

The coating layer 310 coated on the surface of the outside layer 200 to reduce the friction coefficient may include: the bonding layer 310 deposited on the surface of the outside layer 200 and made of Cr or Ti; the support layer 320 deposited on the bonding layer 310 and made of CrN or WC; and the functional layer 330 deposited on the support layer 320 and made of (SiO)-DLC. The description of the coating layer 310 will be replaced by the description of the forming of the coating layer in the manufacturing method.

The thickness ratios of the inside layer 100 and the outside layer 200, respectively, may be 7:3 to 4:6. When the thickness of the inside layer 100 is set to be 1, the thickness ratio may be represented by 1:0.429 to 1:1.5.

The following Table 1 shows the comparison of the stiffness, the toughness, the heat resistance, and the friction coefficient while making the thickness ratio of the inside layer 100 and the outside layer 200 different.

TABLE 1

| Thickness ratio of inside layer and outside layer | Stiffness | Toughness | Heat resistance | Friction coefficient wet (GF4 oil) |
|---|---|---|---|---|
| 9:1 | fail | pass | fail | 0.066 |
| 8:2 | fail | pass | fail | 0.064 |
| 7:3 | pass | pass | pass | 0.060 |
| 6:4 | pass | pass | pass | 0.059 |
| 5:5 | pass | pass | pass | 0.061 |
| 4:6 | pass | pass | pass | 0.058 |
| 3:7 | pass | fail | pass | 0.059 |

Referring to the above Table 1, it may be confirmed that the friction coefficient is certainly reduced at a boundary of thickness ratios of 8:2 and 7:3 and the friction coefficient is rather increased at a boundary of thickness ratios of 4:6 and 3:7.

The following Table 2 shows the comparison of roughness, friction coefficient, heat resistance evaluation, and occurrence of friction and wear of Examples and Comparative Examples under different conditions.

TABLE 2

| | Example 1 | Example 2 | Existing material | Comparative Example 1 | Comparative Example 2 | Comparative Example 3 | Comparative Example 4 | Comparative Example 5 |
|---|---|---|---|---|---|---|---|---|
| Roughness Ra(μm) | 0.44 | 0.45 | 0.43 | 0.94 | 0.63 | 0.42 | 0.72 | 0.53 |
| Friction coefficient dry | 0.30 | 0.25 | 0.90 | 0.80 | 0.40 | 0.35 | 0.32 | 0.45 |

TABLE 2-continued

|  | Example 1 | Example 2 | Existing material | Comparative Example 1 | Comparative Example 2 | Comparative Example 3 | Comparative Example 4 | Comparative Example 5 |
| --- | --- | --- | --- | --- | --- | --- | --- | --- |
| Friction coefficient wet(GF4 oil) | 0.04 | 0.03 | 0.10 | 0.098 | 0.08 | 0.06 | 0.04 | 0.08 |
| Heat resistance evaluation (>250° C.) | Pass | Pass | Pass | Pass | Pass | Pass | Pass | Pass |
| Occurrence of friction and wear | No change | No change | Occurrence of wear | Occurrence of wear | No change | No change | No change | Occurrence of wear |

In Examples 1 and 2, the composite piston pin was surface treated by the treating method according to the exemplary embodiment of the present invention. In the Example 1, the evaluation was made by performing the forming of the coating layer at approximately 120° C. and in the Example 2, the evaluation was performed by performing the forming of the coating layer at approximately 190° C.

In the case of the existing material, the evaluation was made by using the piston pin including the steel material, the Comparative Example 1 performed the evaluation by grinding the surface of the composite piston pin and then sand-blasting the composite piston pin, and the Comparative Example 2 performed the evaluation by grinding the surface of the composite piston pin.

Further, the Comparative Example 3 performed the evaluation by grinding the composite piston pin according to the improving step of the present invention and then polishing the ground composite piston pin, the Comparative Example 4 performed the evaluation by omitting the improving step of the present invention and performing forming of the coating layer on the composite piston pin, and the Comparative Example 5 performed the evaluation by surface treating the composite piston pin according to the treating method of the present invention and performing forming of the coating layer on the surface treated composite piston pin at approximately 250° C.

Comparing with the Examples, it could be appreciated that the existing material has the high friction coefficient and the wear occurs at the test of confirming whether the friction and the wear occur by evaluating the durability of the engine for approximately 320 hours.

Comparing with the Examples, in a case of the Comparative Example 1, the roughness and the friction coefficient were high and the wear occurred at the test of confirming whether the friction and wear occurs.

In a case of the Comparative Example 2, the wear did not occur at the test of confirming whether the friction and wear occur, but comparing with the Examples, the roughness and the friction coefficient were high.

In a case of the Comparative Example 3, the coating layer 310 was not present and therefore comparing with the Examples, the roughness was low but the friction coefficient was high.

In the case of the Comparative Example 4, the friction coefficient was the same level as the Examples but the roughness was high since the improving step is not performed.

Comparing with the Examples, in the case of the Comparative Example 5, the roughness and the friction coefficient were high and the wear occurred at the test of confirming whether the friction and wear occur.

As described above, according to the exemplary embodiments of the present invention, the method of treating a composite piston pin may improve the roughness of the surface of the composite piston pin and perform the coating treatment on the surface to reduce the friction, thereby improving the fuel efficiency when the piston pin is applied to the vehicle.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "interior", "exterior", "inner", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A method of treating a composite piston pin, comprising:
preparing the composite piston pin of which at least a surface layer includes a composite material including a reinforcing fiber and a resin;
improving roughness by processing the at least a surface layer of the composite piston pin; and
forming a coating layer on the at least a surface layer processed to reduce a friction coefficient of the composite piston pin,
wherein the preparing includes:
a first rolling step of rolling a first prepreg including a reinforcing fiber and a resin to enclose an outside surface of a cylindrical mold;
a second rolling step of rolling a second prepreg including a reinforcing fiber having elasticity higher than that of the reinforcing fiber of the first prepreg and a resin to enclose an outside surface of the first prepreg; and a molding step of putting the first prepreg and the second prepreg rolled on the cylindrical mold in an oven and integrally molding the first prepreg and the second prepreg, wherein the second prepreg configured to include the reinforcing fiber aligned in parallel with a longitudinal direction of the composite piston pin, and wherein the first prepreg includes:
 a first layer configured to include the reinforcing fiber aligned perpendicular to the reinforcing fiber of the second prepreg;
 a second layer configured to include the reinforcing fiber aligned in parallel with a longitudinal direction of the composite piston pin, and wherein a ratio between a thickness of the rolled first prepreg and a thickness of the rolled second prepreg is within range of 7:3 to 4:6.

2. The method of claim 1, wherein the improving includes:
 a grinding step of grinding the at least a surface layer of the composite piston pin;
 a first polishing step of polishing the ground at least a surface layer of the composite piston pin using a polishing solution having Ra equal to or less than 6 μm; and
 a second polishing step of polishing the at least a surface layer of the composite piston pin using a polishing solution having Ra equal to or less than 1 μm.

3. The method of claim 1, wherein the forming of the coating layer includes:
 a first coating step of depositing a bonding layer made of Cr or Ti on the at least a surface layer;
 a second coating step of depositing a support layer made of CrN or WC on the bonding layer; and
 a third coating step of depositing a functional layer made of (SiO)-diamond like carbon (DLC) on the support layer.

4. The method of claim 1, wherein the forming of the coating layer is performed at a temperature of 100 to 240° C.

\* \* \* \* \*